United States Patent [19]

Campanelli

[11] Patent Number: 4,878,992
[45] Date of Patent: Nov. 7, 1989

[54] METHOD OF FABRICATING THERMAL INK JET PRINTHEADS

[75] Inventor: Michael R. Campanelli, Webster, N.Y.

[73] Assignee: Xerox Corporation, Stamford, Conn.

[21] Appl. No.: 276,845

[22] Filed: Nov. 25, 1988

[51] Int. Cl.[4] ............... H01L 21/306; B44C 1/22; C03C 15/00; C03C 25/06

[52] U.S. Cl. ............... 156/633; 156/645; 156/657; 156/662; 156/250; 156/510; 346/140 R

[58] Field of Search .............. 156/629, 630, 633, 634, 156/645, 647, 657, 659.1, 662, 250, 264, 268, 510, 526; 125/13 R, 15; 83/33, 39, 43, 663; 437/226; 346/1.1, 140 R

[56] References Cited

U.S. PATENT DOCUMENTS

| | | | |
|---|---|---|---|
| Re. 32,572 | 1/1988 | Hawkins et al. | 156/626 |
| 4,097,310 | 6/1978 | Lindmayer | 136/89 SG |
| 4,564,000 | 1/1986 | Stern et al. | 125/13 R |
| 4,633,847 | 1/1987 | Lossl et al. | 125/13 R |
| 4,638,337 | 1/1987 | Torpey et al. | 346/140 R |
| 4,678,529 | 7/1987 | Drake et al. | 156/234 |

FOREIGN PATENT DOCUMENTS

60-154639  8/1985  Japan .

*Primary Examiner*—William A. Powell
*Attorney, Agent, or Firm*—Robert A. Chittum

[57] ABSTRACT

An ink jet printhead fabrication process wherein a plurality of printheads are produced from two mated substrates by two dicing operations. One dicing operation produces the nozzle face for each of a plurality of printheads and optionally produces the nozzles. This dicing blade, together with specific operating parameters, prevent the nozzles from chipping and the nozzle faces from scratches and abrasions. A second dicing operation with a standard dicing blade severs the mated substrates into separate printheads. The dicing operation which produces the nozzle face is preferably conducted in a two-step operation. A first cut makes the nozzle face, but does not sever the two mated substrates. A second dicing cut severs the two substrates, but does so in a manner that prevents contact by the dicing blade with the nozzle face.

8 Claims, 5 Drawing Sheets

METHOD OF FABRICATING THERMAL INK JET PRINTHEADS

BACKGROUND OF THE INVENTION

1. Field of the Invention

This invention relates to thermal ink jet printing, and more particularly, to an improved method of fabricating a thermal ink jet printhead by a dicing operation capable of finishing the nozzle containing surface.

2. Description of the Prior Art

Thermal ink jet printing is a type of drop-on-demand ink jet systems, wherein an ink jet printhead expels ink droplets on demand by the selective application of a current pulse to a thermal energy generator, usually a resistor, located in capillary-filled, parallel ink channels a predetermined distance upstream from the channel nozzles or orifices. The channel end opposite the nozzles are in communication with a small ink reservoir to which a larger external ink supply is connected.

U.S. Pat. No. Re. 32,572 to Hawkins et al discloses a thermal ink jet printhead and several fabricating processes therefor. Each printhead is composed of two parts aligned and bonded together. One part is a substantially flat substrate which contains on the surface thereof a linear array of heating elements and addressing electrodes, and the second part is a substrate having at least one recess anisotropically etched therein to serve as an ink supply manifold when the two parts are bonded together. A linear array of parallel grooves are also formed in the second part, so that one end of the grooves communicate with the manifold recess and the other ends are open for use as ink droplet expelling nozzles. Many printheads can be made simultaneously by producing a plurality of sets of heating element arrays with their addressing electrodes on a silicon wafer and by placing alignment marks thereon at predetermined locations. A corresponding plurality of sets of channel grooves and associated manifolds are produced in a second silicon wafer. In one embodiment, alignment openings are etched in the second silicon wafer at predetermined locations. The two wafers are aligned via the alignment openings and alignment marks, then bonded together an diced into many separate printheads.

U.S. Pat. No. 4,638,337 to Torpey et al discloses an improved thermal ink jet printhead similar to that of Hawkins et al, but has each of its heating elements located in a recess. The recess walls containing the heating elements prevent the lateral movement of the bubbles through the nozzle and therefore the sudden release of vaporized ink to the atmosphere, known as blow-out, which causes ingestion of air and interrupts the printhead operation whenever this event occurs. In this patent a thick film organic structure such as Riston ® or Vacrel ® is interposed between the heater plate and the channel plate. The purpose of this layer is to have recesses formed therein directly above the heating elements to contain the bubble which is formed over the heating elements, thus enabling an increase in the droplet velocity without the occurrence of vapor blow-out and concomitant air ingestion.

U.S. Pat. No. 4,097,310 to Lindmayer discloses a method of forming silicon solar cells by forming an electron generating junction on a single crystal wafer followed by a diamond blade cut through the wafer. Rotation speeds for the diamond blade fall into the range of 5,000 to 20,000 rpm with a corresponding cutting speed of 0.05 to 10 inches per second.

U.S. Pat. No. 4,564,000 to Stern et al discloses a method of cutting ferrite materials using a resin bonded diamond sawblade at a cutting speed of 5400 centimeters per second. The blade itself has a diameter of 2.25 inches. Cooling means are applied to the blade to prevent overheating of the blade and the ferrite.

U.S. Pat. No. 4,633,847 to Lossl et al discloses a multiple-blade internal hole sawing method for cutting crystal-line rods into thin wafers while maintaining a connection between adjacent cut wafers. The wafers can be cut into thicknesses ranging from 0.1mm to 1.0mm. Connecting agents, such as wax, are used to mechanically connect the cut wafers but can easily be removed by solvent or heating.

Japanese Patent Application No. 59-10182, filed in Japan on Jan. 25, 1984, and published without examination on Aug. 14, 1985, as Laid-Open No. 60-154639 to Mimata discloses a method and apparatus for dicing wafers using rotary blades of different widths to cut grooves into the wafers. The cut with a first rotary saw is deep enough to remove patterns but the through-wafer dicing is done by another rotary saw of a smaller width.

In all ink jet printing systems, the nozzle or orifice size, shape, and surface conditions affect the characteristics and trajectory of the ink droplet emitted from the nozzle. Some ink jet printers have a separate nozzle plate which is independently fabricated to obtain the desired dimensional tolerances and surface conditions. This nozzle plate is then aligned and bonded to the droplet generator or printhead. In addition to the dimensional precision, attachment is sometimes difficult and debonding is a constant concern. Also, if an adhesive is used, it may flow into the nozzle or ink paths, thereby restricting or impairing the droplet ejection and/or trajectory. Other ink jet printers have printheads fabricated from two substrates, as disclosed in the prior art discussed above, in which one substrate contains the heating elements and the other contains ink recesses, which, when the substrates are aligned and bonded together, serve as ink passageways. The open ends of the passageways terminate about 1.0 to 5.0 mils in front of the heating elements and create the nozzles. The front face of the printhead containing the nozzles have a major impact on the droplet characteristics and trajectories. One discontinuity at the nozzle is made by the adhesive bond and has a tendency to cause weeping of the ink therefrom. Generally, a polishing operation removes the bonding discontinuity as well as other surface defects.

In these and other fabrication methods, the printhead nozzle plate with nozzle containing surface must be fabricated separately and bonded to the printheads, photolithographically produced separately by complex photo-processing, or the nozzle containing surface must be polished. All of these methods of fabrication do not lend themselves well to making economical or technically sound devices.

This invention overcomes the disadvantages of the prior art fabrication methods and enables an acceptable nozzle and nozzle containing surface finish to be concurrently formed in one process step. Use of an optimized dicing blade and dicing process with predetermined operating parameters, enable the concurrent sectioning of the mated wafers into individual printheads and forming of the nozzle containing surface.

This surface has a finish sufficient to prevent deleterious effect on the droplet or its trajectory without the need of further processing.

SUMMARY OF THE INVENTION

It is an object of the present invention to provide an improved fabricating method for an ink jet printhead.

It is another object of this invention to provide a printhead fabricating method for sectioning two or more mated substrates, one substrate containing a plurality of sets of heating elements and addressing electrodes and the other substrate containing a corresponding plurality of sets of ink channels with each set having an associated manifold and ink inlet. The sectioning operation produces a plurality of individual printheads, and concurrently produces the printhead nozzle face having a surface finish suitable for use without the need for further surface smoothing operations such as polishing.

In the present invention, a plurality of thermal ink jet printheads are obtained from a structure consisting of an electrically insulative or semi-conductive substrate having a plurality of sets of passivated heating elements and addressing electrodes formed thereon, which is aligned and bonded to a silicon substrate having a corresponding plurality of sets of etched ink channels and associated manifold with ink inlet, and a polymer layer such as, for example, Vacrel ®, sandwiched therebetween with etched pits which are aligned to expose each of the heating elements, as disclosed in the above-identified patent to Torpey et al. The individual printheads are produced by a sectioning operation, generally accomplished through dicing by a dicing blade. The final layer making up the sectionable structure is an adhesive layer comprising a two-part thermal setting epoxy approximately 0.5 to 1.0 micron thick which bonds the silicon substrate with the recesses to the polymer layer covering the insulative or semi-conductive layer having the passivated heating elements and electrodes. This adhesive layer and its method of application is described more fully in U.S. Pat. No. 4,678,529 to Drake et al.

For forming a nozzle face, a two-step dicing operation is the preferred sectioning procedure, though a single dicing step is sufficient. When using the two-step procedure, the first step is performed by a circular resinoid dicing blade having a predetermined thickness, diameter, and surface speed range to produce the nozzle face with the appropriate surface finish. The first step cuts through the silicon substrate, adhesive layer, and polymer layer, but only partially enters the insulative or semiconductive surface. Thus, after the first step, the bonded structure remains together by the relatively thin silicon material at the bottom of relatively deep grooves defining the rows of individual printheads. The second dicing step uses a second standard blade which may have a smaller thickness. The second blade is directed along the grooves formed by the first steps to separate the bonded substrate into individual rows of printheads, this second dicing blade is then used to cut the rows into individual printheads.

A more complete understanding of the present invention can be obtained by considering the following detailed description in conjunction with the accompanying drawings, wherein like parts have like index numerals.

DESCRIPTION OF THE PREFERRED EMBODIMENT

According to U.S. Pat. No. 4,638,337 to Torpey et al and U.S. reissue No. Re. 32,572 to Hawkins et al, thermal ink jet printheads may be mass produced by sectioning of at least two mated planar substrates containing on confronting surfaces thereof respective matched sets of linear arrays of heating elements with addressing electrodes and linear arrays of parallel elongated grooves, each set of grooves being interconnected with a common recess having an opening through the opposite substrate surface. The elongated grooves serve as ink channels, and the common recess serves as an ink reservoir or manifold. The recess opening is the ink inlet to which an ink supply is connected. Each ink channel contains a heating element and the sectioning operation, generally a dicing operation, opens the ends of the ink channels opposite the ends connecting with the manifold, if not already open, and forms the nozzle containing surface. After the sectioning operation, the heating elements are located at a predetermined location upstream from the nozzles. The main difference between the above identified patents is that Torpey et al contains an intermediate thick film polymer layer sandwiched between the mated substrates. The thick film layer is etched to expose the heating elements, this effectively places the heating elements in a pit whose vertical walls inhibits vapor bubble growth in the direction parallel to the heating element surface. This prevents vapor blowout and the resultant ingestion of air which produces a rapid printhead failure mode.

This invention relates to an improved dicing method for sectioning of the multiple printhead containing substrates into separate printheads as disclosed in the U.S. patents to Torpey et al and Hawkins et al and, accordingly, U.S. Pat. Nos. 4,638,337 and Re. 32,572 are hereby incorporated by reference. Though these and other prior art delineate dicing as a means of sectioning mated wafers, none define a dicing blade and dicing operating parameters which will provide a substantially defect free nozzle and nozzle face (i.e., a nozzle bearing surface). Thus, all prior art diced printheads require subsequent treatment of their nozzle faces by such finishing operations as grinding, lapping, or polishing. In addition, when multi-layered structures, which have different grinding, lapping, and polishing characteristics, are processed to provide a desired surface finish, it is very difficult to obtain a surface which is planar within the desired flatness tolerance.

Figure 1:
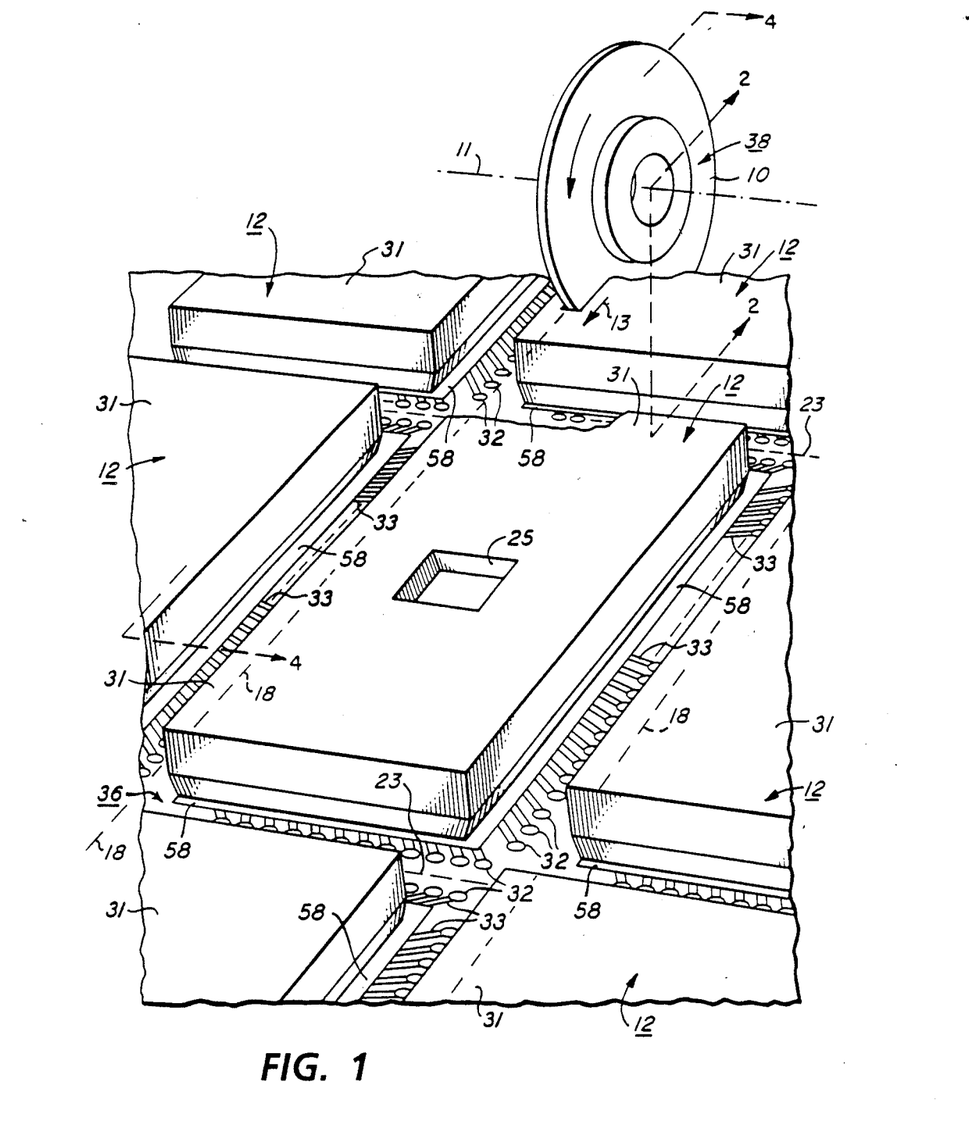
FIG. 1 is an enlarged isometric view of the channel wafer bonded to the heating element wafer, after the excess channel wafer material has been removed to expose the addressing electrode terminals, and showing the dicing blade of the present invention as it forms the nozzle containing surfaces of the printheads.

Referring to FIG. 1, a resin based dicing blade 10 of the present invention is shown cutting across an edge of the channel plates 31 in the direction of arrow 13 to form the nozzles 27 and nozzle face 29 (see FIGS. 3 and 4) for the plurality of printheads 12. Prior to this dicing operation, excess silicon material is milled from the silicon channel wafer or upper substrate to form the individual channel plates 31 and uncover the addressing electrode terminals 32. As disclosed in the patent to Torpey et al, etched grooves and recesses (not shown) around the periphery of the channel plates greatly assist in preventing damage to the addressing electrodes 33 and their terminals 32 during this silicon removal step by spacing the channel wafer therefrom.

In the preferred embodiment, the thick film polymer layer 58 between the channel plates 31 and the heating element substrate 36 is etched to remove it from the distal ends of the electrodes 33 and their contact pads or terminals 32. Each channel plate has an inlet 25 which may be separately etched in the channel plates or they may be simply formed by etching the manifold 22 (see FIGS. 2 and 3) completely through the channel wafer from which the channel plates 31 are formed.

The dicing blade 10 is rotated about axis 11. For a dicing blade having a diameter of approximately two inches and a thickness of about 4–10 mils, the speed may range from 32,000 to 45,000 rpm. The blade has a relatively hard, dense resin bonded base material with substantially no abrasive fillers and contains a 60 to 90% concentration of natural or synthetic diamonds having a nominal diamond size range of 2 to 6 micrometers. The density reference is based on 72 carats per cubic inch. The dicing cut to provide the nozzle containing surface with the appropriate surface finish and optionally to open the nozzles is made along dashed lines 18. The dashed cutting lines 23 which are perpendicular to the dashed cutting lines 18 delineate the travel of a second standard dicing blade to complete the sectioning of channel plates 31 and heating element wafer 36 into separate printheads 12.

Figure 2:
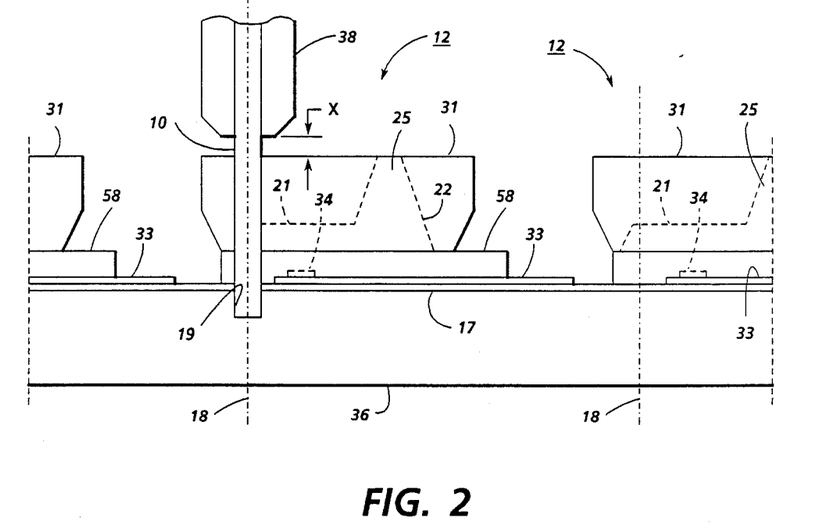
FIG. 2 is an enlarged partially shown cross sectional view of FIG. 1 taken along a plane including the dicing blade axis of rotation and radius located normal to the wafers.

FIG. 2 is a cross sectional view of FIG. 1 as viewed along view line 2-2 and shows that the dicing blade 10 cuts through the channel plates 31, thick film layer 58, adhesive bonding layer 15 (see FIG. 5), electrode insulating underglaze layer 17, passivation layer (not shown), and partially into the heating element wafer 36 a predetermined distance. In general, the blade penetration depth versus blade width ratio falls within the range of 6:1 to 9:1. If the ratio is 10:1 or higher, the blade will wander, thus eliminating the saw cut's positional accuracy of ±0.1 mils. A high ratio also deleteriously affects nozzle surface quality. If the ratio is lower, the removal of cut material becomes excessive and results in a stressed cut which again causes surface defects that adversely impacts droplet quality and trajectory. The ink channel 21, manifolds 22, and heating elements 34 are shown in dashed line for reference to the dicing cut centerline 18. Although in the preferred embodiment the dicing blade 10 only notches the heating element wafer, it could completely cut through both the channel plates 31 and heating element wafer 36. The penalty for this complete cut through is a shorter life of the resin bonded blade. The shorter life is caused by the adhesive used to hold the heating element wafer 36 to a standard wafer holding film frame (not shown).

Another critical aspect of the dicing procedure is the blade exposure minus the penetration depth referred to in FIG. 2 as "X". The value "X" must fall into the range of 6 to 12 mils. Less than 6 mils, clearance and coolant cannot get to the blade. This causes high friction resulting in a stressed cut and subsequent nozzle damage. More than 12 mils clearance and the blade vibrates and damages the nozzle and scars the nozzle face 29.

For the integrated circuit industry, the ability to process die by sawing or dicing is well known, but being able to create a nozzle face surface having an acceptable surface finish via dicing alone is totally unknown. By omitting a subsequent finishing operation, such as polishing, the fabrication of a relatively smooth surface by high quality dicing allows higher throughput of devices, resulting in an extremely economical and cost effective manufacturing operation.

Figure 3:
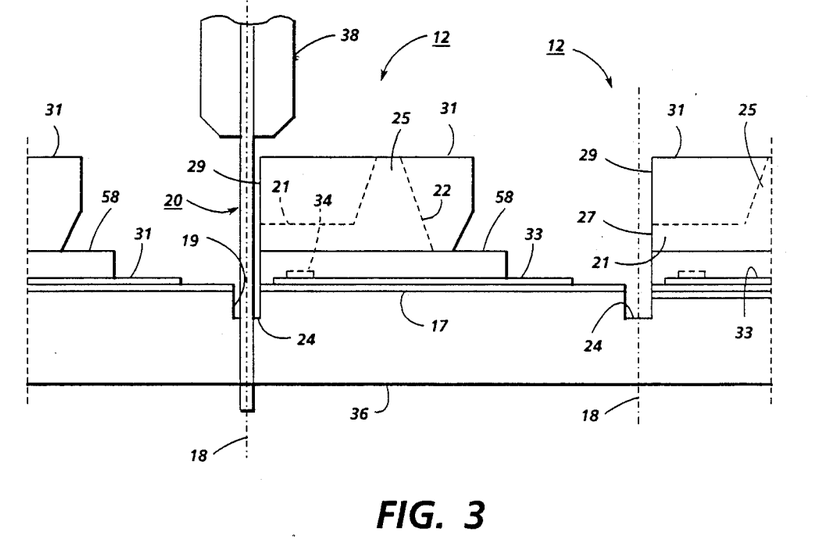
FIG. 3 is the same view as FIG. 2 but taken subsequent in time showing the second dicing operation which sections the bonded wafers into rows of printheads.

FIG. 3 is the same view as FIG. 2, but shown after nozzle 27 and nozzle containing surface 29 were formed by the dicing blade 10 as it cuts along dicing centerline 18. FIG. 3 shows the notches 19 in the heating element wafer 36 which were produced as a result of the cuts by dicing blades 10. Along the same dicing cut centerline 18 and also along dicing cut lines 23 perpendicular thereto, a standard dicing blade 20, optionally thinner than blade 10, severs the heating element wafer 36 and produces a plurality of separate print heads 12. If the dicing blade 20 is the same or thicker than the resin bonded blade 10, then the wafer 36 must be slightly tilted relative to the dicing blade (not shown), so that the nozzle containing surface 29 is not contacted.

Figure 4:
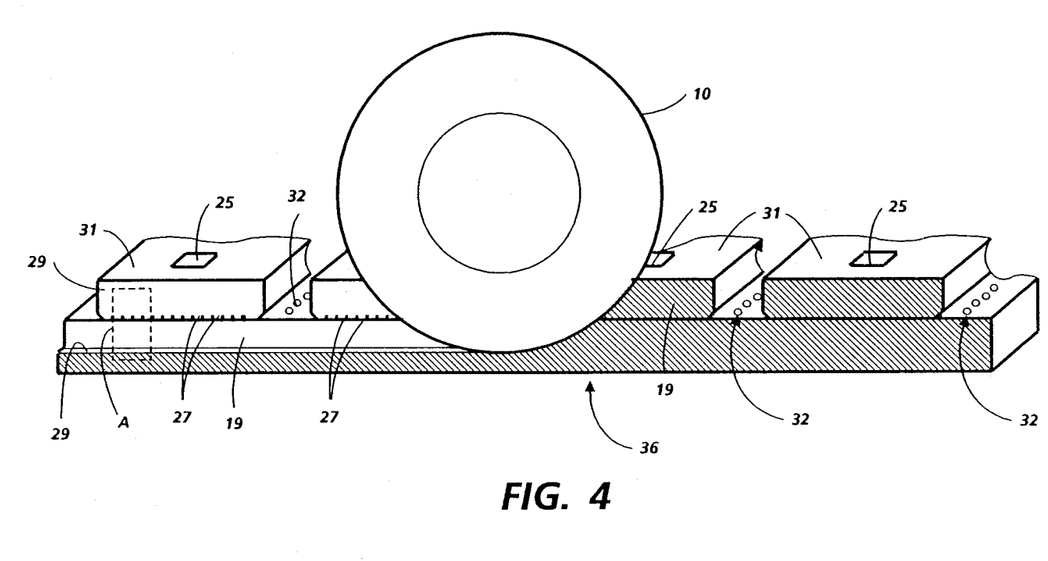
FIG. 4 is a partial, cross sectional isometric view of FIG. 1 showing the formation of the nozzle containing surface.
Figure 5:
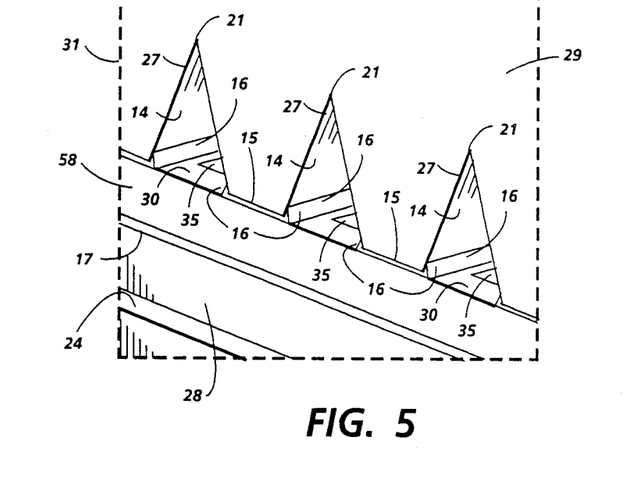
FIG. 5 is an enlarged isometric view of the portion of FIG. 4 enclosed by dashed lines and identified as "A".
Figure 6:
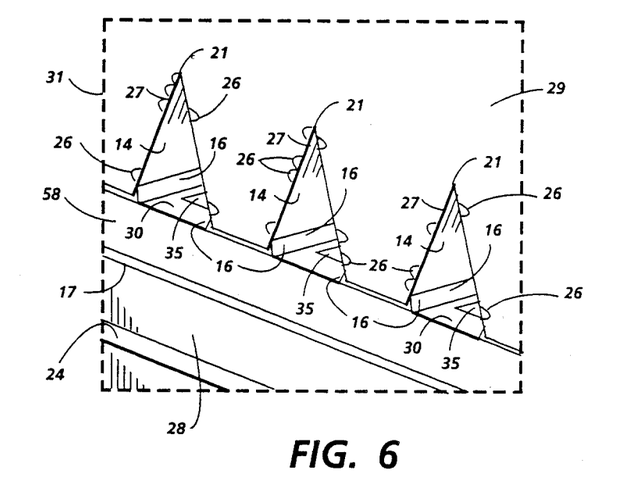
FIG. 6 is a view similar to FIG. 5 but showing the nozzle and nozzle containing surface defects caused by a prior art dicing operation.
Figure 7:
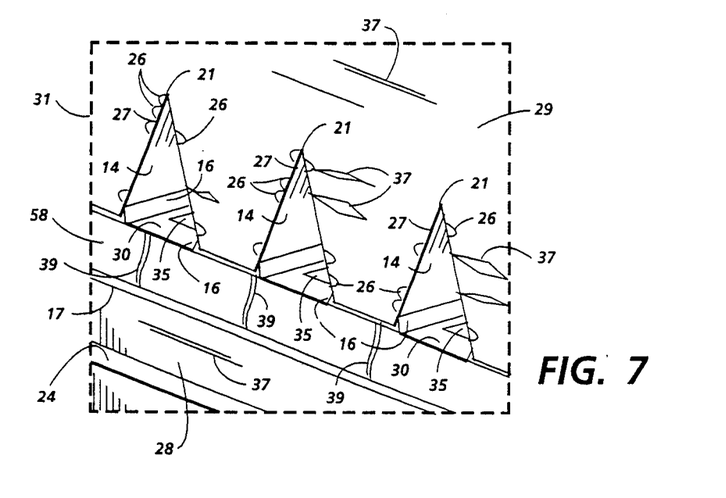
FIG. 7 is a view similar to FIG. 5 but showing the nozzle and nozzle containing surface defects caused by still another prior art dicing operation.

FIG. 4 is an isometric view of the heating element wafer 36 and the channel plates 31 bonded thereto as viewed along view line 4-4 of FIG. 1. As the dicing blade 10 of the present invention cuts along cutting line 18, nozzles 27 and nozzle containing surface 29 are formed and the heating element wafer is partially cut, resulting in an elongated notch 19 being produced having a floor 24. FIGS. 5–7 are an enlarged view of the portion of FIG. 4 enclosed in dashed line and identified as area "A".

FIG. 5 is an enlarged partially shown view of the nozzles 27 and nozzle containing surface 29 showing the abrasion and scratch free nozzles and nozzle containing surface or face. This view shows a portion of the heater plate 28, produced by the dicing operation from heating element wafer 36, thick film layer 58, and channel plate 31. The triangular ink channels with interior walls 14 that were etched into the channel plate, produce the nozzles 27 when the channel plate is diced by the dicing blade 10. Other different materials are concurrently diced; namely, the electrode underglaze layer 17, electrode passivation layer (not shown), and the bonding material 15 which is generally an adhesive. Adhesive fillets 16 form along the length of the ink channel at the interface between the thick film and the channel plate. Etched through holes 35 in the thick film layer 58 effectively place the heating elements (not shown) in a pit for inhibiting the lateral movement of the bubble growth during printhead operation, so that air ingestion is avoided. In spite of the dissimilar materials encountered by the dicing blade during the dicing operation, the blade 10 in combination with its operating parameters, delineated below, produced a high quality surface finish as well as chip and scratch free nozzles. Thus, this method of creating a quality orifice or nozzle surface at the same time the sectioning operation occurs allows high throughput with established parts handling techniques. Step 24 is produced by the dicing operation with the second standard dicing blade 20, if this second blade has a smaller thickness than the resin bonded blade 10. The width of this step is 1 mil or less and has no impact on the printing performed by the printhead. To achieve the desired nozzle and nozzle face surface finish, specific operating parameters are required:

(a) the dicing blade must be a resin based blade, and the composition must contain a relatively hard dense resin bonded base material.

(b) the blade must contain little or no abrasive fillers, and must have a high density fine diamond distribution in which the diamond acts as the abrasive medium. The diamonds may be natural or synthetic, have a nominal diamond size range from 2 to 6 micrometers and a diamond concentration of 60 to 90%. The density reference is based on 72 carats per cubic inch.

(c) the blade penetration depth versus blade width ratio must fall within the range of 6:1 to 9:1. Blade thickness is dependent upon the depth of the cut, for example, the preferred thickness range of the blade is 4 to 10 mils for penetrations of 30 to 40 mils. If the ratio is higher than 9:1, the blade will wander, thus eliminating saw cut quality and dimensional precision. If the ratio is lower, the removal of cut material becomes excessive and again affects saw cut quality.

(d) the feed speed of the dicing blade into the silicon ranges from 0.011 inches per second to about 0.16 inches per second, with the preferred speed being around 0.12 inches per second.

(e) the final aspect of the dicing process dictates that the surface velocity of the dicing blade and silicon be greater than 3,200 inches per second and preferably 4,000 inches per second or about 40,000 rpm's for a two inch diameter saw blade.

• The two key factors involved in this process, outside the art of dicing silicon, are the use of resin bonded versus metal bonded blades and process speeds equal to or greater than 3200 inches per second (30,000 rpm's with a two inch diameter saw blade) versus dicing speeds greater than 4000 inches per minute or dicing blade speeds of 40,000 rpm's.

For the integrated circuit industry, the ability to process die by sawing is well known. However, the capability of being able to create a nozzle-quality, polished surface by using a dicing blade without the need for further surface treatments is not known. Dicing by the above operating parameters provide a 98% device yield. Assuming a printhead having 50 nozzles per printhead, with one chip caused by the sawing operation between two adjacent nozzles constituting a failure, means a nozzle dicing yield would be required of around 100%. Only the dicing operation of the present invention provides such a yield.

There is a linear relationship between the surface velocity ($S_v$) of the blade and the substrate speed (F) in inches per second; $S_v$ approximately equals $F \times 2.9 \times 10^4 + 2400$. Surface velocity can easily be converted to rpm's for a given diameter blade. In general, the blade penetration depth versus blade width ratio falls within the range of 6:1 to 9:1. If the ratio is 10:1 or higher the blade will wander, thus eliminating the saw cuts positional accuracy; ±0.1 mils. A high ratio may also effect nozzle cut quality. If the ratio is lower, the removal of cut material becomes excessive, resulting in a stressed cut and again such cut affects nozzle quality.

the final critical aspect of the dicing procedure is the blade exposure minus penetration depth. Refer to FIG. 2 wherein this dimension is identified as "X". The blade exposure is that portion of the blade extending from the blade holder 38. This value must fall in the range of about 6 to 12 mils. Less than 6 mils clearance and coolant cannot get to the blade. This causes high friction resulting in a stress cut and subsequent nozzle damage. More than 12 mils clearance and the blade support becomes weak resulting in a high vibration cut which again results in nozzle damage.

The procedure of dicing according to the present invention in order to obtain the appropriate nozzle containing surface finish increases blade wear. The integrated circuit industry does not usually operate at speeds higher than 30,000 rpm's or run with resinoid blades for this very reason. It becomes economically inefficient. With the resinoid blades used, the wear rate is approximately 1 to 2 mils per three inch diameter wafer pair processed. Given the constraint on the exposure minus the penetration, this suggests that a flange change be required after processing three to four wafer pairs. It is estimated that the approximate flange sets of about 30 wafer pairs can be processed per blade. Assuming 300 die per wafer pair, 9,000 could be produced with a single resin bonded blade. Also, considering process speeds discussed above, these 9,000 die or printheads could be produced in one day. Thus, though the blade wear is much higher than would be desired, the alternative is that the nozzles and nozzle faces would require a subsequent finishing or polishing operation.

FIG. 6 is a similar view to that of FIG. 5 but showing the effects of a nozzle and nozzle surface created by either a metal bonded or resin based dicing blade produced by dicing blade speeds of 3,300 inches per second or less (30,000 rpm's or less for a two inch diameter blade). Numerous chips 26 of silicon material have been removed from the periphery of the nozzle rendering it non-functional. Any chip or material void larger than 2 micrometers is not acceptable.

FIG. 7 is a similar view to that of FIG. 5 but shows the quality of nozzle and nozzle containing surface produced by a metal bonded blade operating at 4,000 inches per second (40,000 rpm's for a two inch diameter blade). Note the chips 26 produced by the slower rotating dicing blades in FIG. 6 are also present with a higher speed metal bonded blade. In addition, severe scratching and abrasions 37 on the surfaces of the nozzle containing surface and even larger chips 26 are produced at the nozzle by the metal bonded blades. The metal bonded blades at the higher rpm speed not only scars the surfaces produced by the metal bonded blade, but produces saw marks 39 in the thick film layer 58.

Figure 8:
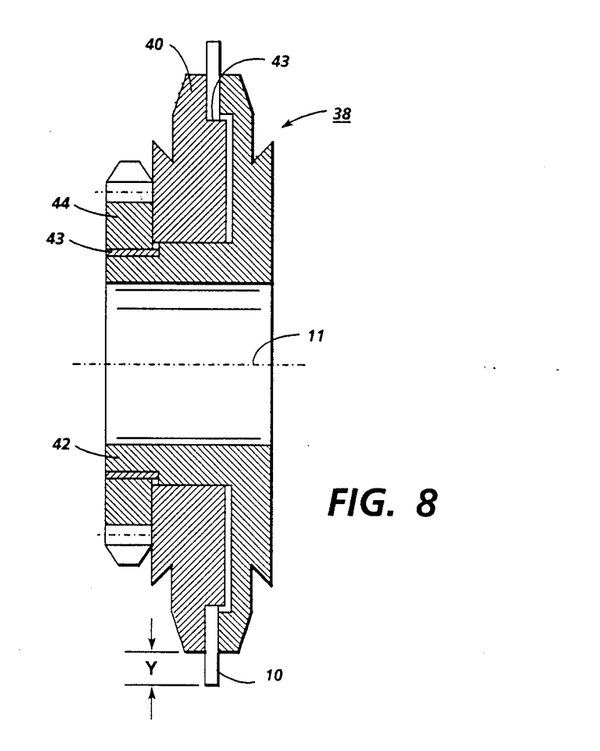
FIG. 8 is a cross sectional view of the dicing blade of the present invention in a blade holder or flange.

FIG. 8 is a schematic cross sectional view of a typical dicing blade holder or flange 38 which comprises inner flange 40 and outer flange 42 between which the dicing blade 10 is held on the circular shoulder 43 of inner flange 40. Flange nut 44 tightened on screw threads 43 of outer flange 42 lock the dicing blade in place. The blade holder is mounted on a rotatable shaft (not shown) which rotates the blade holder about axis 11. The exposure of the blade identified as "Y" is that part of the circular dicing blade which extends from the blade holder and referred to as the exposure. As discussed above, the blade exposure "Y" minus the depth of penetration of the blade into the material being cut is identified by the dimension "X" in FIG. 2 and is, of course, a critical aspect of this dicing operation as discussed above.

In summary, an inexpensive process for creating a high quality orifice and orifice containing surface in silicon ink jet printheads is enabled by the use of a high density, fine grit diamond resin bonded saw blade operated at very high process speeds with the appropriate depth of penetration and blade holder clearance.

Many modifications and variations are apparent from the foregoing description of the invention and all such modifications and variations are intended to be within the scope of the present invention.

I claim:

1. A method of fabricating a plurality of ink jet printheads from at least two substrates having confronting surfaces aligned and bonded together, wherein the confronting surface of one substrate contains a plurality of sets of equally spaced, linear arrays of heating elements and addressing electrodes having terminals for enabling the individual addressing of each heating element with current pulses, and wherein the confronting surface of the other substrate contains a plurality of sets of equally spaced, parallel grooves and a recess, one end of each set of grooves communicate with an ink supply means, the fabricating method comprising the steps of:
   (a) removing the substrate material above the electrode terminals on the other substrate and thus producing a plurality of separate portions in which each contain one set of grooves and interconnected recesses;
   (b) dicing the end portions from each separate substrate portion containing the ends of the set of grooves opposite the ends communicating with the ink supply means to form a nozzle face containing open groove ends, the open groove ends to serve subsequently as droplet emitting nozzles, the dicing being accomplished by a first circular, resin-bonded blade having a predetermined diamond particle size and density, the blade having a predetermined diameter and thickness, and operated at a speed of greater than 32,000 inches per second with a predetermined depth of cut, so that the entire region containing grooves are cut; and
   (c) dicing in a direction perpendicular to the nozzle faces to separate the rows of printheads into individual printheads.

2. The method of claim 1 wherein the dicing by the first blade cuts through the entire thickness of the substrate portions containing the grooves in a first dicing cut to form the nozzle face, but the predetermined depth of cut prevents cutting through the other substrate, so that only a notch is formed therein, and wherein step (b) further comprises the step of:
   dicing along the notch in said other substrate with a second dicing cut to separate the bonded substitutes into a plurality of attached rows of printheads, the second dicing cut being done in a manner not to contact the nozzle face produced by the first dicing cut.

3. The method of claim 2, wherein the second dicing cut is made by a second circular dicing blade.

4. The method of claim 3, wherein the second dicing blade is thinner than said first dicing blade.

5. The method of claim 1, wherein the predetermined depth of cut by said first blade has a ratio with the first blade thickness within the range of 6:1 to 9:1.

6. The method of claim 5, wherein the first blade exposure less the predetermined depth of cut is within the range of 6 to 12 mils or 0.15 to 0.3 mm.

7. The method of claim 6 wherein the first blade has a feed speed from 0.011 inches per second to about 0.16 inches per second.

8. The method of claim 6, wherein the predetermined diamond particle size is within the diamond size range of 2 to 6 micrometers, and wherein the predetermined diamond density is a diamond concentration of 60% to 90% with a density reference based on 72 carats per cubic inch.

* * * * *